United States Patent [19]

Ziemek et al.

[11] 4,397,081
[45] Aug. 9, 1983

[54] MAKING A SUPERCONDUCTIVE TUBE

[75] Inventors: Gerhard Ziemek, Langenhagen; Herbert Kubiak, Hanover, both of Fed. Rep. of Germany

[73] Assignee: Kabelmetal Electro GmbH, Hanover, Fed. Rep. of Germany

[21] Appl. No.: 257,094

[22] Filed: Apr. 24, 1981

[30] Foreign Application Priority Data

Apr. 26, 1980 [DE] Fed. Rep. of Germany ....... 3016179

[51] Int. Cl.³ ............................................. H01V 11/14
[52] U.S. Cl. ...................................... 29/599; 29/527.1
[58] Field of Search .............................. 29/599, 527.1

[56] References Cited

U.S. PATENT DOCUMENTS 3,866,315 2/1974 Ziemek ................................. 29/599

Primary Examiner—Lowell A. Larson
Assistant Examiner—V. K. Rising
Attorney, Agent, or Firm—Ralf H. Siegemund

[57] ABSTRACT

The method of U.S. Pat. No. 3,866,315 is improved by brushing copper particles also on the other side of the niobium ribbon prior to, e.g., rolling and by increasing the layer's thickness by an electrolytic process. That layer will be on the outside of the tube. Tin is subsequently deposited thereon; and by means of annealing, the tin is caused to diffuse through this outside copper layer and into the niobium to form a uniform $Nb_3Sn$ layer.

7 Claims, 2 Drawing Figures

MAKING A SUPERCONDUCTIVE TUBE

BACKGROUND OF THE INVENTION

The present invention relates to the making of a corrugated, copper-stabilized Nb3Sn superconductor.

Nb3Sn is a superconductive compound which is highly suitable for cryogenic current conduction because its transition temperature of about 18° Kelvin is, for this material, unusually high and can, therefore, be readily operated with.

U.S. Pat. No. 3,866,315 and German printed patent application No. 2,443,226 relate to methods of making such a superconductor; a ribbon of niobium is worked in that copper particles are brushed onto the ribbon and, thereafter, a thick copper layer is electroplated onto the ribbon. Next, the ribbon is longitudinally folded in order to obtain a split tube, welded along its edges, and the resulting tube is corrugated. Thereafter, a tin layer is deposited onto the niobium and annealed in a vacuum for obtaining the compound Nb3Sn in the interface of tin and niobium. A problem has arisen here concerning the depositing of the tin layer which should be thin, but must be continuous, without any holes or weak spots because the Nb3Sn layer should be as uniform as possible for the purpose of obtaining a uniform current density in cryogenic use.

DESCRIPTION OF THE INVENTION

It is an object of the present invention to provide a new and improved method of making superconductors as basically outlined above, but in a manner that improves their yield.

It is a feature of the present invention to continue the use of a niobium ribbon with brushed-on copper particles and enhancement of the thickness of this copper layer. Also, the ribbon is to be longitudinally folded for obtaining a split tube, welding the tube along adjoining ribbon edges, and corrugating the tube.

In accordance with the preferred embodiment of the invention, it is now suggested to additionally brush copper particles also onto the other side of the niobium ribbon prior to tube-forming and to, possibly, enhance the thickness of that second brushed-on layer which will be the outer surface of the tube when formed. Subsequently, tin is applied to that outer layer which is followed, possibly immediately, by a heat treatment process which causes the tin to diffuse throughout the copper until reaching the niobium. Further heat treatment causes the tin to diffuse into the niobium so that Nb3Sn is formed. The heat treatment is to be carried out at a temperature in excess of 600° C., preferably even in excess of 800° C.

It was surprisingly found that this thinly brushed-on copper layer facilitates greatly the diffusion process and results in a uniform diffusion of tin into the niobium. Also, the time it takes for the tin to complete this requisite diffusion is quite short so that one can manufacture continuously.

Enhancement of the thickness of this second copper layer is preferably carried out after the copper-plated niobium layer with brushed-on copper particles on the second side is plastically deformed, e.g., by rolling, stretching, or otherwise. The resulting tubular conductor is really a niobium copper compound sheet tube having a relatively large copper cross section and a small, relative niobium content. The rolling actually improves the metallic copper-to-niobium bond.

DESCRIPTION OF THE DRAWINGS

While the specification concludes with claims, particularly pointing out and distinctly claiming the subject matter which is regarded as the invention, it is believed that the invention, the objects and features of the invention, and further objects, features and advantages thereof, will be better understood from the following description taken in connection with the accompanying drawings, in which:

Proceeding now to the detailed description of the drawings, the process begins with a thin niobium ribbon having copper particles of 0.1 mm to 1.0 mm thickness. Fine copper particles are continuously brushed onto one side of that ribbon, as described, e.g., in U.S. Pat. No. 3,866,315 mentioned above. As a consequence, a very thin copper layer of about 10 mg/dm$^2$ (=0.1 mg/m$^2$) on the average is provided on that one niobium ribbon side. Also as described in said patent, the ribbon is thereafter electroplated on that side in one or several, serially arranged electrolytic baths. Accordingly, a relatively thick copper layer of, say, 0.5 mm thickness is grown on that one niobium ribbon side. This additional, stabilizing copper layer should be at least 0.3 mm thick, but not more than 0.8 mm. A range of 0.4 mm to 0.6 mm is preferred.

Next, the copper-plated ribbon is rolled, with or without application of heat, at a degree of deformation in excess of 50% in order to obtain a uniform thickness. In lieu of rolling, one may stretch the ribbon. Generally speaking, the niobium-plus-copper ribbon should undergo some plastic deformation (of at least 50%) in such a manner that the metallic bond between the copper and the niobium is enhanced. Soft-annealing may follow this rolling (or other working) process.

Figure 1:
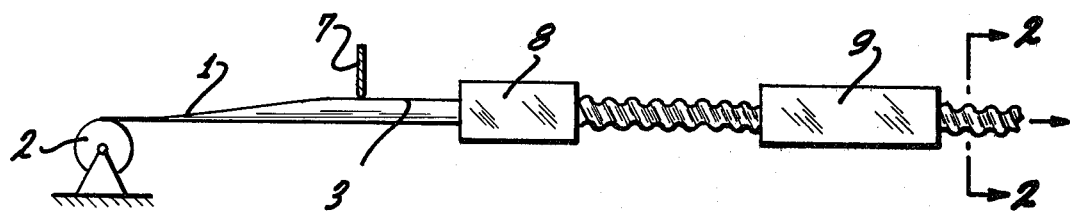
FIG. 1 is a schematic representation of a production line to be used for practicing the preferred embodiment of the invention in accordance with the best mode thereof.

In accordance with specific features of the invention, the ribbon is now treated by a brushing-on of copper also on the other (niobium) side for obtaining a similarly thin copper particle layer. Conceivably, this copper layer may also be enhanced as to its thickness by an electrolytic plating process. This increase or growth in and of the second copper layer should amount to at least several $\mu$. This second layer should be approximately 10$\mu$ to 120$\mu$ thick, preferably 40$\mu$ to 80$\mu$. By way of example, it may be approximately 60$\mu$ thick (combined layers 6 and 11 in FIG. 2, infra). This then is still considerably thinner than the first-mentioned copper layer (being combined layers 4 and 11 in FIG. 2). The resulting ribbon 1, e.g., is stored in a drum 2 until used in the production line shown in FIG. 1.

The ribbon is longitudinally folded into a smooth wall-split tube, whereby the thicker copper layer faces the interior of the tubes, the second, thin copper layer faces outwardly. Adjoining edges of the folded ribbon are welded in 7 to close the tube. It should be noted that in a separate cutting process edge portions of the niobium ribbon may be trimmed off so that only the thick copper portions adjoin directly for welding, the trimmed niobium edges will be spaced a little. This will avoid any mutual interference of copper and niobium during the welding process.

The closed tube is corrugated in a station 8 which may be a corrugating device for obtaining a helical corrugation or one for obtaining an annular corrugation pattern.

The corrugated tube is next passed through a tank 9 which is a tin bath, for depositing tin onto the outer surface of the tube. Another downstream station (not shown) heats the tube sufficiently, e.g., at least up to 600° C., preferably up to 800° C. The tin will now diffuse through the thin, outer copper layer and into the niobium whereupon $Nb_3Sn$ is obtained. As stated earlier, the thin copper layer ensures an easy and uniform diffusion of the tin, first into the copper and then through that thin copper layer into the niobium. The resulting application of the tin to the niobium in that manner is surprisingly more uniform than in the case of direct application.

Tin plating can be obtained also by an electrolytic process or by flame spraying. In the case of a tin bath as shown, there may immediately be provided a diffusion annealing for obtaining the migration of tin molecules into and through the thin copper layer and into the niobium. In other words, 8 can be construed to be a combined tin-depositing and diffusion-annealing station.

Figure 2:
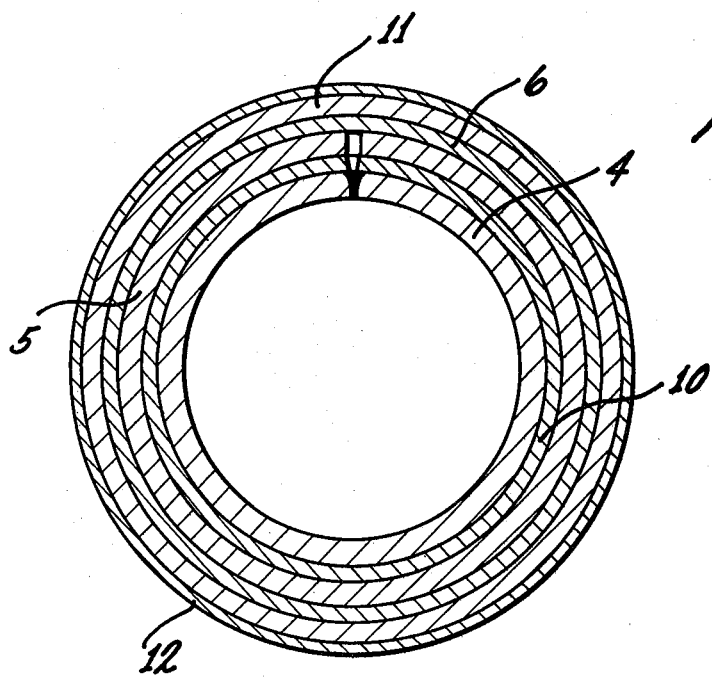
FIG. 2 is a cross section through a new superconductor made by the inventive method, the section being taken as per line A—A; but for reasons of simplification, the corrugation has been eliminated from the illustration in order to concentrate on the layer assembly as depicted herein; also, the layers are not drawn to a relative scale.

FIG. 2 is a cross section through the completed conductor. The innermost layer 4 of this tube is the thick copper layer that was plated on first, onto a niobium ribbon 5. The interface of niobium and copper was originally the first brushed-on copper layer 10 which, however, will be more or less obliterated as an independent layer by the copper electroplating.

The outer layer of the tubularly folded niobium ribbon 5 carries a thin, brushed-on copper layer 6. The illustrated thickness of the brushed-on layers is grossly exaggerated for ease of illustration. A thin copper layer 11 was galvanically, i.e. electrolytically, plated onto the outer brushed-on layer 6. Tin 12 constitutes the outer layer of the assembly. The desired composition $Nb_3Sn$ is formed between the copper particle layer 6 and the niobium ribbon 5. The ribbon now is actually just one of several intimately joined strata of a multilayered tube.

We claim:

1. The method of making a copper-stabilized, corrugated tin-niobium superconductor which includes brushing copper onto one side of a niobium ribbon, electroplating additional copper onto the brushed-on copper, folding the ribbon into a split tube, the copper facing inwardly, welding the adjoining edges of the ribbon and corrugating the resulting tube, the improvement comprising:

providing a very thin copper layer including brushing copper particles onto the opposite side of said niobium ribbon, prior to forming said split tube, the copper particles facing outwardly after said forming;

applying tin to the outer copper layer; and heat-treating the tube with tin sufficiently applied for obtaining diffusion of the tin through the outer copper layer followed by formation of $Nb_3Sn$ as the tin diffuses into the niobium.

2. A method as in claim 1, said providing layer including an electrolytically increasing layer thickness of the brushed-on copper to at least several $\mu$.

3. A method as in claim 2, the increasing providing a thickness between $10\mu$ and $120\mu$.

4. A method as in claim 2, the increasing providing a thickness between $50\mu$ and $80\mu$.

5. A method as in claim 1 or 2, wherein the heating for obtaining diffusion is carried out immediately following the tin depositing.

6. A method as in claim 2 and including the step of plastically deforming the ribbon after said brush-on step as per the improvement but prior to said subsequent increasing step.

7. A method as in claim 1, said additional copperplating providing a layer thickness between 0.3 mm to 0.8 mm, being significantly thicker than said very thin copper layer as per the improvement.

* * * * *